United States Patent
Volynets et al.

(10) Patent No.: US 10,249,485 B2
(45) Date of Patent: Apr. 2, 2019

(54) PULSED PLASMA ANALYZER AND METHOD FOR ANALYZING THE SAME

(71) Applicant: SAMSUNG ELECTRONICS CO., LTD., Suwon-si, Gyeonggi-Do (KR)

(72) Inventors: Vladimir Volynets, Hwaseong-si (KR); Protopopov Vladimir, Suwon-si (KR); Young Do Kim, Hwaseong-si (KR); Yuri Barsukov, Suwon-si (KR); Sang Heon Lee, Seongnam-si (KR); Sung Ho Jang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/727,198

(22) Filed: Oct. 6, 2017

(65) Prior Publication Data
US 2018/0130651 A1 May 10, 2018

(30) Foreign Application Priority Data
Nov. 10, 2016 (KR) .................. 10-2016-0149469

(51) Int. Cl.
| | |
|---|---|
| *G01J 3/30* | (2006.01) |
| *H01J 49/40* | (2006.01) |
| *C23C 16/455* | (2006.01) |
| *G01J 3/443* | (2006.01) |
| *H01J 37/32* | (2006.01) |
| *H01J 49/00* | (2006.01) |
| *H01J 49/10* | (2006.01) |
| *H01J 49/12* | (2006.01) |

(Continued)

(52) U.S. Cl.
CPC ........ *H01J 49/40* (2013.01); *C23C 16/45502* (2013.01); *G01J 3/2889* (2013.01); *G01J 3/443* (2013.01); *H01J 37/32963* (2013.01); *H01J 49/0031* (2013.01); *H01J 49/10* (2013.01); *H01J 49/12* (2013.01); *H01L 21/02274* (2013.01); *H01L 29/78696* (2013.01); *H01J 2237/327* (2013.01)

(58) Field of Classification Search
CPC .. H01J 49/00; H01J 49/10; H01J 49/12; H01J 49/40; H01J 37/32; H01L 21/02; H01L 29/786; G01J 3/44; G01N 21/718; C23C 16/455

See application file for complete search history.

(56) References Cited

U.S. PATENT DOCUMENTS

| | | |
|---|---|---|
| 5,980,767 A | 11/1999 | Koshimizu et al. |
| 8,377,723 B2 | 2/2013 | Nagai et al. |

(Continued)

FOREIGN PATENT DOCUMENTS

| | | |
|---|---|---|
| JP | 2013-187226 | 9/2013 |
| KR | 10-2015-0098129 | 5/2015 |

*Primary Examiner* — Abdullahi Nur
(74) *Attorney, Agent, or Firm* — F. Chau & Associates, LLC.

(57) ABSTRACT

A pulsed plasma analyzer includes a pulse modulator that controls an off-time of a pulsed plasma that includes a target radical, an optical spectrometer that measures optical emissions of the pulsed plasma after the off-time to determine optical emission data, and a concentration estimating module that estimates a concentration of the target radical during the off-time based on an initial optical emission value of the optical emission data that changes as a function of the off-time, and outputs an estimated concentration.

19 Claims, 12 Drawing Sheets

(51) Int. Cl.
*H01L 21/02* (2006.01)
*H01L 29/786* (2006.01)
*G01J 3/28* (2006.01)

(56) References Cited

U.S. PATENT DOCUMENTS

| | | |
|---|---|---|
| 9,371,579 B2 | 6/2016 | Varadarajan et al. |
| 2009/0181545 A1 | 7/2009 | Negishi et al. |
| 2012/0006258 A1 | 1/2012 | Schasfoort et al. |
| 2013/0049592 A1* | 2/2013 | Yeom ............... H01J 37/32091 315/111.21 |
| 2014/0273309 A1 | 9/2014 | Niyogi et al. |
| 2015/0124250 A1 | 5/2015 | Bao et al. |
| 2015/0318220 A1 | 11/2015 | Kobayashi et al. |

* cited by examiner

PULSED PLASMA ANALYZER AND METHOD FOR ANALYZING THE SAME

This application claims priority under 35 U.S.C. § 119 from, and the benefit of, Korean Patent Application No. 10-2016-0149469, filed on Nov. 10, 2016 in the Korean Intellectual Property Office, the contents of which are herein incorporated by reference in their entirety.

BACKGROUND

1. Technical Field

Embodiments of the present inventive concept are directed to a pulsed plasma analyzer and a method for analyzing the same.

2. Discussion of the Related Art

The wall conditions of a plasma chamber can greatly influence the result of a plasma process. In particular, a radical wall recombination phenomenon in a low pressure plasma process can influence the result of a plasma process. Therefore, it is desirable to precisely control a plasma process based on wall conditions of a plasma chamber.

Since radical kinetics, such as the radical lifetime in a low pressure plasma process, are very sensitive to the wall conditions of the plasma chamber, by analyzing radical kinetics during a plasma etching process, etc., a plasma etching process can be more precisely controlled.

SUMMARY

Embodiments of the present inventive concept can provide a pulsed plasma analyzer which precisely analyzes radical kinetics.

Further embodiments of the present inventive concept can provide a plasma device which precisely analyzes radical kinetics.

Still further embodiments of the present inventive concept can provide a pulsed plasma analysis method for precisely analyzing radical kinetics.

According to embodiments of the present inventive concept, there is provided a pulsed plasma analyzer that includes a pulse modulator that controls an off-time of a pulsed plasma that includes a target radical, an optical spectrometer that measures optical emissions of the pulsed plasma after the off-time and outputs optical emission data, and a concentration estimating module that estimates a concentration of the target radical during the off-time, based on an initial optical emission value of the optical emission data that changes as a function of the off-time, and outputs the estimated concentration.

According to embodiments of the present inventive concept, there is provided a plasma device that includes a pulsed plasma device that includes a pulse generator that generates a pulse having first and second levels, and a plasma chamber in which a plasma containing a target radical is generated while s second level pulse is applied, and a radical concentration estimator that estimates a concentration of the target radical while a first level pulse is applied, wherein the radical concentration estimator measures optical emission of the plasma, while changing duration of the first level pulse, and estimates the concentration of the target radical while the second level pulse is applied based on the measured optical emission.

According to embodiments of the present inventive concept, there is provided a method of operating a pulsed plasma analyzer, including providing a pulsed voltage into a plasma chamber to generate a pulsed plasma inside the plasma chamber; initializing an off-time of the pulsed plasma and a counter which counts a number of changes of the off-time; measuring optical emissions of the pulsed plasma; estimating the concentration of the target radicals during the off-time based on the changes of the initial optical emission values of the optical emission data during the off-time, when the counter is equal to a preset maximum; determining a fitting function that fits the estimated concentration; and estimating a lifetime of the target radical as the time when a value of the fitting function falls below a preset value.

BRIEF DESCRIPTION OF THE DRAWINGS

FIG. 1b illustrates an optical spectrometer of FIG. 1a.

FIG. 3 is a flow chart of a method of operating a pulsed plasma analyzer of FIG. 1a.

FIG. 6 illustrates the estimation of the concentration of target radicals by the concentration estimating module of FIG. 1a.

FIG. 7 is a graph of the concentration of the target radical during the off-time as estimated by a concentration estimating module of FIG. 1a.

DETAILED DESCRIPTION OF EXEMPLARY EMBODIMENTS

Hereinafter, a pulsed plasma analyzer according to some embodiments of the present inventive concept will be described with reference to FIGS. 1a to 2.

Figure 1A:
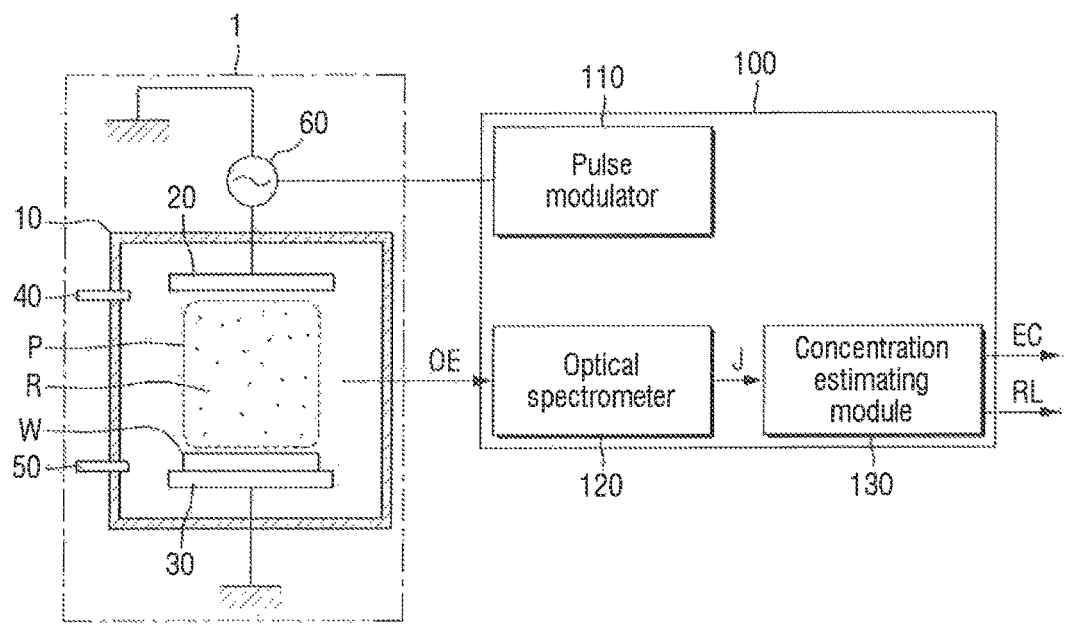
FIG. 1a illustrates a pulsed plasma analyzer according to some embodiments of the present inventive concept.
Figure 1B:
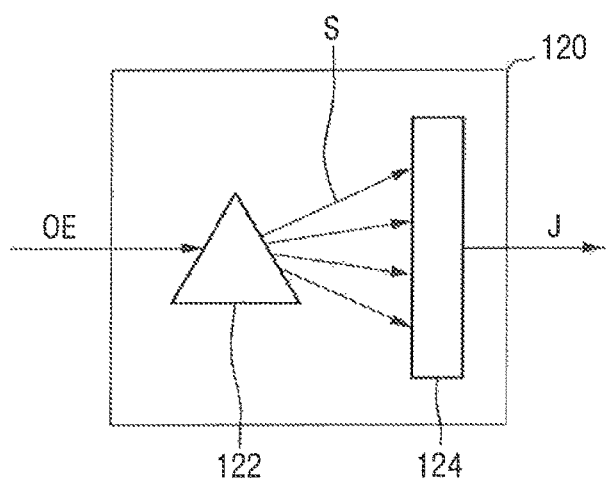

FIG. 1a illustrates a pulsed plasma analyzer according to some embodiments of the present inventive concept. FIG. 1b illustrates an optical spectrometer of FIG. 1a. FIG. 2 is a graph of the concentration of a target radical according to a pulse and the optical emission of the target radical.

Referring to FIG. 1a, a pulsed plasma analyzer 100 operates in conjunction with a pulsed plasma device 1 which performs a plasma process. For convenience of explanation, FIG. 1a illustrates a plasma device used in a plasma etching process. However, embodiments of the present disclosure are not limited thereto, and the pulsed plasma device 1 may include plasma devices used in other plasma processes, such as a plasma cleaning process or a plasma deposition process.

The pulsed plasma device 1 includes a plasma chamber 10, an upper electrode 20, a lower electrode 30, a gas supply pipe 40, a gas exhaust pipe 50 and a power supply 60.

According to embodiments, the gas supply pipe 40 connected to the plasma chamber 10 injects gas used for the plasma process into the plasma chamber 10. In some embodiments, the gas supply pipe 40 injects gas used for an etching process into the plasma chamber 10.

For example, gasses such as $NF_3$, $N_2$, $O_2$, $H_2$, etc., may be used in an etching process, but embodiments of the present disclosure are not limited thereto.

According to embodiments, the gas exhaust pipe 50 connected to the plasma chamber 10 exhausts gasses generated during the plasma process out of the plasma chamber 10.

According to embodiments, the lower electrode 30 is grounded and has a ground potential. The upper electrode 20 is connected to the power supply 60 and forms an electric field between the upper electrode 20 and the lower electrode 30 inside the plasma chamber 10.

That is, according to embodiments, the power supply 60 provides a voltage between the upper electrode 20 and the lower electrode 30. In a present embodiment, the power supply 60 is an alternating current (RF) power supply, but embodiments are not limited thereto, and the power supply 60 can be a direct current (DC) power supply.

According to embodiments, because of the voltage provided to the power supply 60, the injected gas generates plasma in the plasma chamber 10, and the generated plasma etches a wafer W placed on the lower electrode 30.

At this time, according to embodiments, the power supply 60 provides a voltage in the form of a pulse between the upper electrode 20 and the lower electrode 30. In this case, pulsed plasma (P) is generated inside the plasma chamber 10 that is repetitively generated and disappears based on the pulses.

According to embodiments, the pulsed plasma P includes radicals. Specifically, electrons drawn in between the upper electrode 20 and the lower electrode 30 by the power supply 60 collide with the gas particles injected into the plasma chamber 10, and such collisions generate radicals by breaking particle bonds to separate the particles.

In some embodiments, the pulsed plasma P includes a target radical R to be analyzed by the pulsed plasma analyzer 100. When a gas containing a plurality of elements is injected into the plasma chamber 10, the target radical R includes a plurality of different radicals. For example, when $NF_3$, $N_2$, $O_2$, $H_2$, etc., are injected into the plasma chamber 10 for a plasma etching process, the plurality of target radicals R include, e.g., N, F, O and H radicals.

Figure 2:
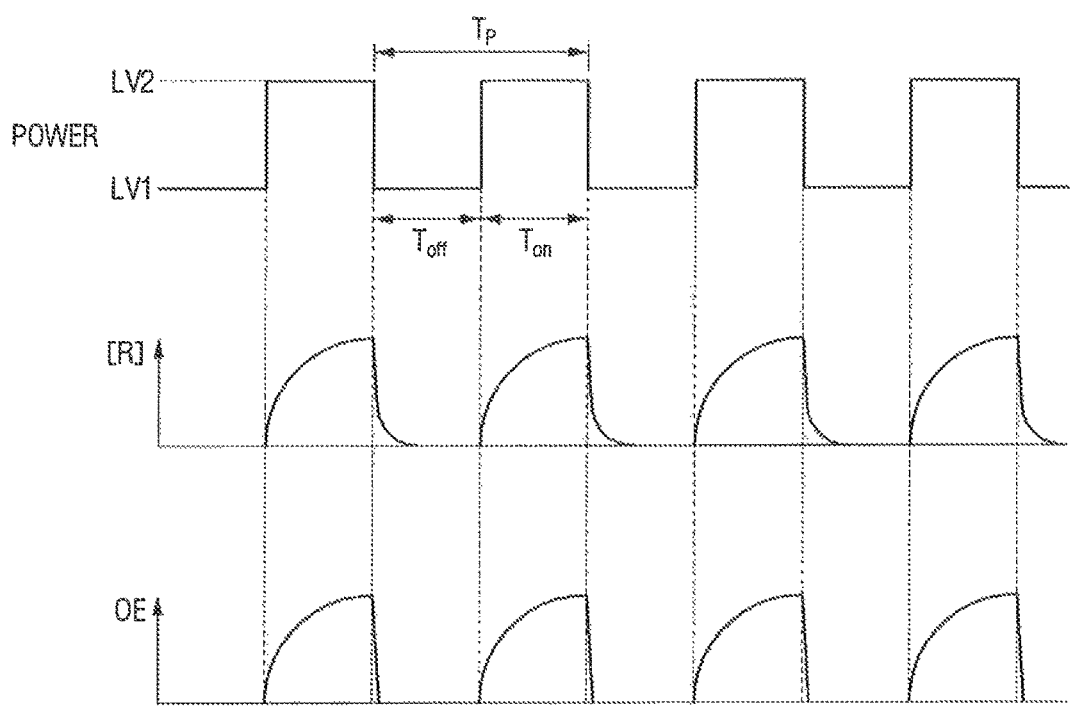
FIG. 2 is a graph of the concentration of a target radical according to a pulse and the optical emission of the target radical.

Referring to FIG. 2, according to embodiments, a pulse generated by the power supply 60 has first and second levels (LV1, LV2).

According to embodiments, the power supply 60 does not generate new plasma in the first level LV1 pulse, and since the unstable target radical R continues to disappear, the concentration [R] of the target radicals R decreases. However, the power supply 60 generates new plasma during the second level LV2 pulse, and the concentration [R] of the target radicals R in the plasma chamber 10 increases accordingly. At this time, the concentration [R] of the target radicals R increases, until the rates of generation and disappearing of the target radicals R reach an equilibrium state.

That is, according to embodiments, within one pulsed plasma cycle Tp, letting the time during which the first level LV1 pulse is applied be defined as an off-time $T_{off}$, and letting the time during which the second level LV2 pulse is applied be defined as an on-time $T_{on}$, the concentration [R] of the target radicals R repeatedly increases during the on-time $T_{on}$ and decreases during the off-time $T_{off}$.

According to embodiments, during the on-time $T_{on}$, the generated target radicals R are excited into a high energy state by collisions with electrons, but the excited target radical R is energetically unstable and relaxes back to the original, lower, energy state. At the time of relaxation, energy corresponding to the difference in energy levels is emitted as electromagnetic waves, and the optical emission OE of FIG. 2 illustrates such electromagnetic waves. That is, as the concentration [R] of the target radicals R increases, the optical emissions OE increase.

However, according to embodiments, during the off-time $T_{off}$, the optical emission OE decreases much more rapidly than the concentration [R] of the target radicals R. This is due to the fact that electrons are no longer drawn into the plasma chamber 10 by the power supply 60 during the off-time $T_{off}$. That is, during the off-time $T_{off}$, even if target radicals R exists, since the drawn electrons abruptly disappear, the optical emission OE rapidly decreases as compared to the concentration [R] of the target radicals R.

Referring again to FIG. 1a, according to embodiments, the pulsed plasma analyzer 100 includes a pulse modulator 110, an optical spectrometer 120 and a concentration estimating module 130.

According to embodiments, the pulse modulator 110 generates the voltage provided by the power supply 60 in the form of a pulse. Specifically, the pulse modulator 110 generates the voltage, which is not in the form of the pulse provided by the power supply 60, in a pulsed form, thereby generating a pulsed plasma P inside the plasma chamber 10.

In addition, according to embodiments, the pulse modulator 110 adjusts the shape of the pulse generated by the power supply 60. Referring to FIG. 2, the pulse modulator 110 adjusts the pulse of the power supply 60 by shortening or lengthening the pulsed plasma cycle Tp. In some embodiments, the pulse modulator 110 adjusts the pulse of the power supply 60 by lengthening the pulsed plasma cycle Tp from 10 μs to 10 s.

Further, according to embodiments, the pulse modulator 110 can adjust the pulse of the power supply 60 by shortening or lengthening the off-time $T_{off}$ within the fixed pulsed plasma cycle Tp, which decreases or increases the on-time $T_{on}$ accordingly. According to embodiments, the ratio of the on-time $T_{on}$ to the pulsed plasma cycle Tp is defined as a duty ratio, which will be described below with respect to the description of FIG. 6.

According to embodiments, the optical spectrometer 120 provides optical emission data J, by measuring the optical emission OE of the pulsed plasma P generated inside the plasma chamber 10. Specifically, referring to FIG. 1b, the optical spectrometer 120 includes a spectroscope 122 and a detector 124, and uses them to measure the optical emission OE and provide the optical emission data J.

More specifically, according to embodiments, the spectroscope 122 spectrally separates the optical emission OE of the pulsed plasma P according to wavelength to form a spectrum S. For example, the spectroscope 122 may be a prism or grating. Subsequently, the detector 124 measures the intensity of the various wavelengths in the spectrum S to provide optical emission data J. That is, the optical emission data J includes the emission intensity for each wavelength.

For example, when a charge-coupled device (CCD) is used as the detector 124, the spectroscope 122 can provide the optical emission data J by measuring the intensity of the different wavelengths and converting the intensity into an electric signal.

According to embodiments, as a result, the optical spectrometer 120 can simultaneously analyze the kinetics of various types of radicals by simultaneously measuring the optical emission OE of the various types of target radicals R. In some embodiments, the optical spectrometer 120 can provide the optical emission data J by simultaneously measuring wavelengths from 300 nm to 850 nm.

Further, according to embodiments, the optical spectrometer 120 separately divides the optical emission OE of the various types of target radicals R by spectrally separating the optical emission OE. In some embodiments, the optical spectrometer 120 provides the optical emission data J by measuring the spectrum S with a spectral resolution of 2 nm.

In some embodiments, the optical spectrometer 120 measures the optical emission OE with a time-gated method. This will be described below in detail with reference to FIGS. 4 to 5b.

Referring again to FIGS. 1a and 2, according to embodiments, the concentration estimating module 130 estimates the concentration [R] of the target radical R during off-time $T_{off}$ to provide an estimated concentration EC based on the initial optical emission value of the optical emission data J that changes during the off-time $T_{off}$. In some embodiments, the concentration estimating module 130 further provides a lifetime RL of the target radical R. This will be described below in detail with reference to FIGS. 6 and 7.

Hereinafter, the operation of a pulsed plasma analyzer according to some embodiments of the present inventive concept will be described with reference to FIGS. 1 to 7.

Figure 3:
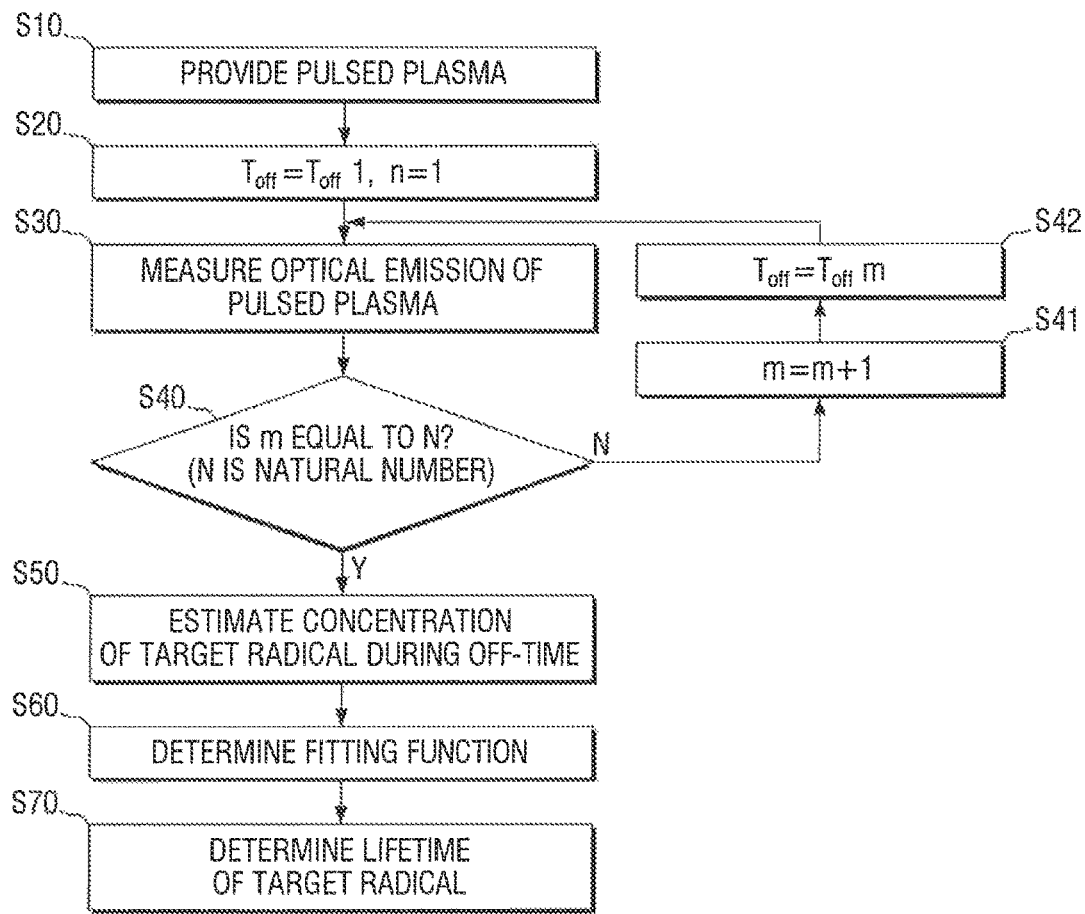
Figure 4:
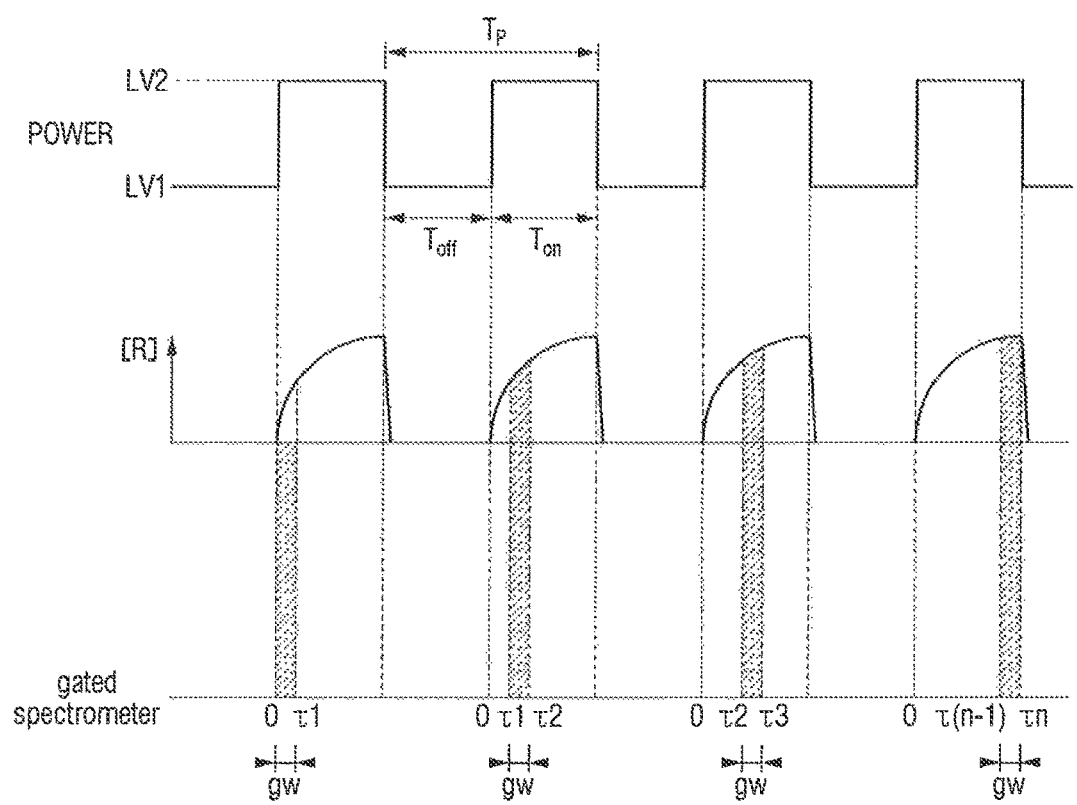
FIG. 4 illustrates the measurement of the optical emission of a pulsed plasma by the optical spectrometer of FIG. 1a by the time-gated method.
Figure 5A:
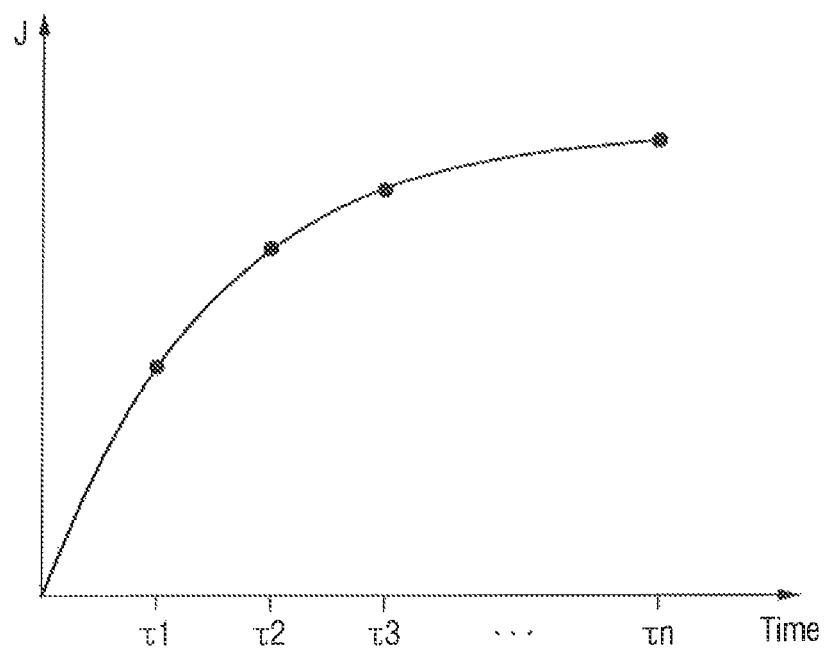
FIGS. 5a and 5b are graphs of the optical emission of the pulsed plasma measured by the optical spectrometer of FIG. 1a as a function of time.
Figure 5B:
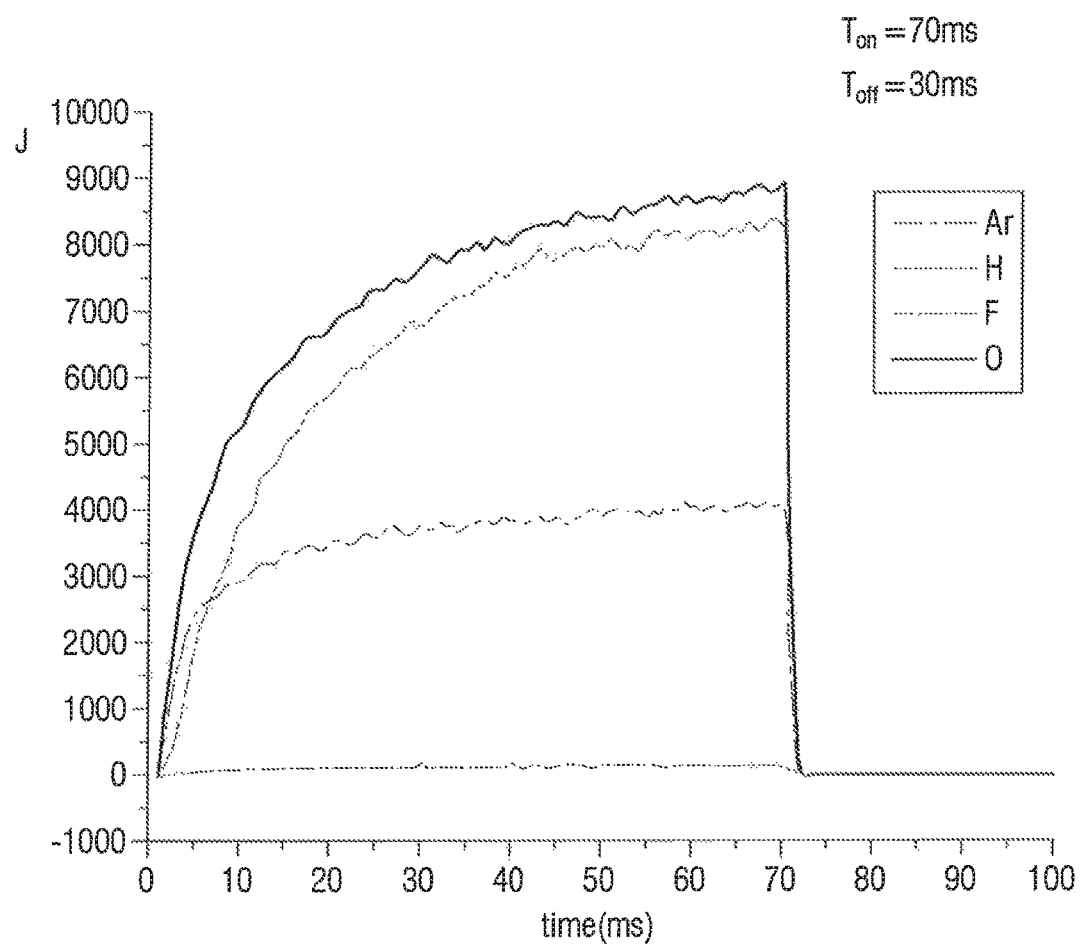
Figure 6:
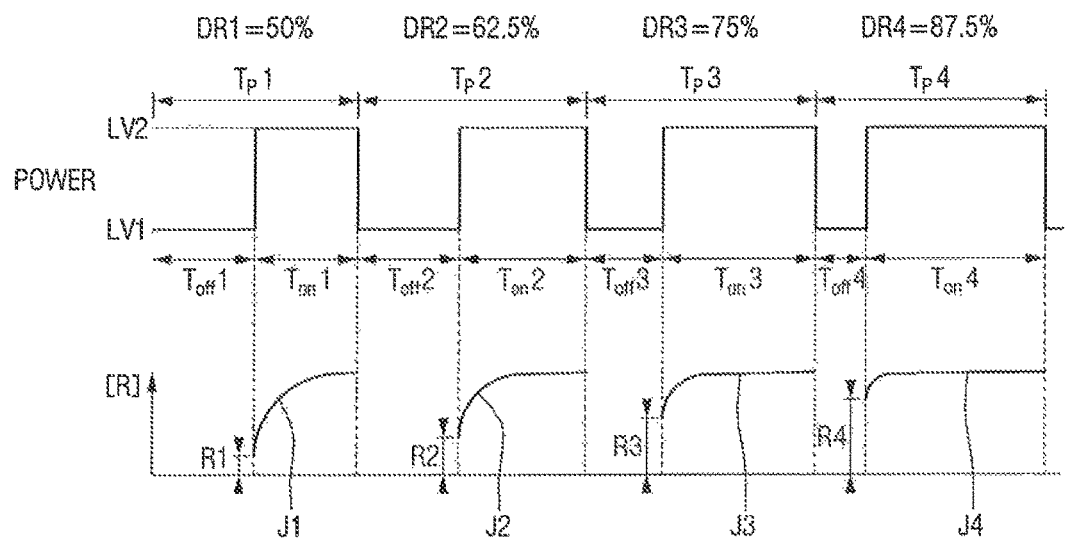
Figure 7:
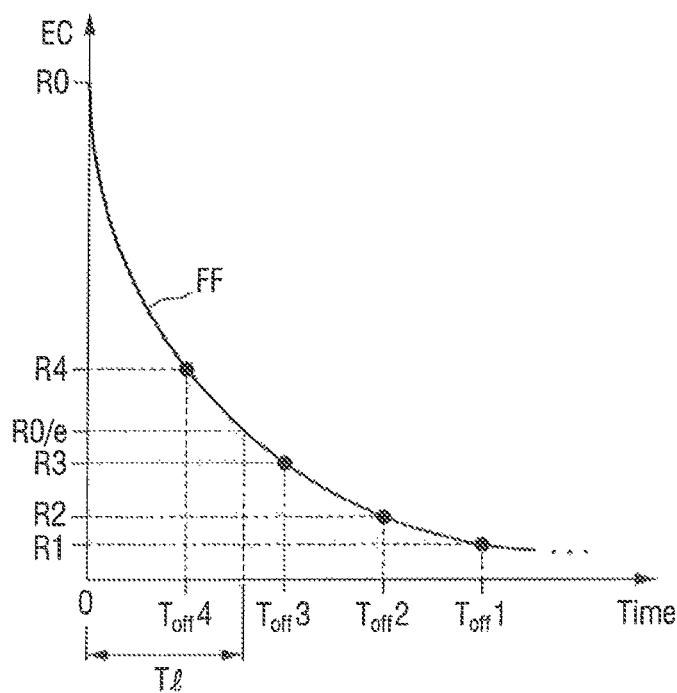

FIG. 3 is a flow chart of a method of operating a pulsed plasma analyzer of FIG. 1a. FIG. 4 illustrates the measurement of the optical emission of a pulsed plasma by the optical spectrometer of FIG. 1a by the time-gated method. FIGS. 5a and 5b are graphs of the optical emission of the pulsed plasma measured by the optical spectrometer of FIG. 1a as a function of time. FIG. 6 illustrates the estimation of the concentration of target radicals by the concentration estimating module of FIG. 1a. FIG. 7 is a graph of the concentration of the target radical during the off-time as estimated by a concentration estimating module of FIG. 1a.

Referring to FIGS. 1a and 3, according to embodiments, pulsed plasma is provided (S10).

Specifically, according to embodiments, the power supply 60 provides a pulsed voltage between the upper electrode 20 and the lower electrode 30 to generate a pulsed plasma P inside the plasma chamber 10.

Subsequently, according to embodiments, the off-time $T_{off}$ of the pulsed plasma P is set to a first off-time Toff1, and a loop number m which counts the number of changes of the off-time $T_{off}$ is set to 1 (S20).

Specifically, according to embodiments, the pulse modulator 110 sets the off-time $T_{off}$ of the pulsed plasma P to the first off-time $T_{off1}$ and sets the loop number m to 1. For example, when the loop number m is 1 and the pulsed plasma cycle Tp is 100 ms, the pulse modulator 110 sets the first off-time $T_{off1}$ of the pulsed plasma P to 50 ms.

Next, according to embodiments, referring to FIGS. 1a and 3, the optical emission OE of the pulsed plasma P is measured (S30).

Specifically, according to embodiments, the optical spectrometer 120 provides the optical emission data J by measuring the optical emission OE of the pulsed plasma P.

For example, when the loop number m is 1, the optical spectrometer 120 provides the optical emission data J by measuring the emission OE of the pulsed plasma. As described above with reference to FIGS. 1a and 1b, the optical spectrometer 120 can simultaneously divide and measure the optical emission OE of various types of target radicals R by simultaneously measuring the intensity of the various wavelengths of the spectrum S.

In some embodiments, the optical spectrometer 120 measures the optical emission OE using a time-gated method. The time-gated method continuously measures the optical emission OE by dividing a specific time into a gate width having a shorter time and delaying it in subsequent on-times to measure the change in optical emission OE during specific time. For example, referring to FIG. 4, the optical spectrometer 120 continuously measures the optical omission OE during the on-time $T_{on}$ by dividing the on-time $T_{on}$ by n-times, where n is a natural number, to form a gate width gw and by delaying the gate width gw in subsequent on-times to measure the optical emission OE of the pulsed plasma P during the on-time $T_{on}$.

Specifically, according to embodiments, referring to FIGS. 4 and 5a, the optical spectrometer 120 measures and records the optical emission OE during the period of 0 to first time τ1 as the gate width gw just after the start of the on-time $T_{on}$ at the first pulse. At the subsequent second pulse, the optical spectrometer 120 measures and records the optical emission OE during the period of the first time τ1 to the second time τ2 as the gate width gw. Similarly, at the subsequent third pulse, the optical spectrometer 120 measures and records the optical emission OE during the period of the second time τ2 to the third time τ3 as the gate width gw. The optical spectrometer 120 repeats this process, and at the n-th pulse, the optical spectrometer 120 records the optical emission OE during the (n−1)th time (τ(n−1)) to the n-th time (τn) as the gate width gw. At this time, the continuously measured optical emission OE for each pulse is provided as a function of time as shown by the graph of FIG. 5a. In addition, the optical spectrometer 120 provide the optical emission OE thus measured and recorded as the emission data J.

According to embodiments, the gate width gw is the time resolution of the pulsed plasma analyzer 100. Therefore, by shortening the gate width gw, the pulsed plasma analyzer 100 measures the optical emission OE of the target radical R with a more precise time resolution. In some embodiments, the gate width gw may be from about 1 μs to about 1 s.

As in FIG. 5a, FIG. 5b is a graph of the optical emission OE of various target radicals R simultaneously measured by a time-gated method as a function of time. In FIG. 5b, the pulsed plasma P includes various target radicals R, such as Ar, H, F and O radicals, and has a pulsed plasma cycle Tp of 100 ms with an on-time $T_{on}$ of 70 ms and an off-time $T_{off}$ of 30 ms. That is, the optical spectrometer 120 provides the optical emission data J as illustrated in the graph of FIG. 5b by simultaneously measuring the optical emission OE of various target radicals R with precise time resolution.

Referring again to FIGS. 1a to 3, the off-time $T_{off}$ of the pulsed plasma P is adjusted (S40 to S42).

Specifically, according to embodiments, the pulse modulator 110 sets in advance the number N of loops which is the number of times that the off-time $T_{off}$ is changed, and when the loop number m is not equal to the preset loop number N, the loop number m is incremented by 1 (S41). Subsequently, the pulse modulator 110 changes the off-time $T_{off}$ to the m-th off-time $T_{off}$m (S42), and the optical spectrometer 120 measures the optical emission OE of the pulsed plasma P according to the changed off-time $T_{off}$ (S30) and outputs the optical emission data J. When the loop number m is equal to the number of loops N, the pulse modulator 110 does not change the off-time $T_{off}$ and the next step S50 is performed.

For example, according to embodiments, if the loop number m is 1, the optical spectrometer 120 measures the optical emission OE of the pulsed plasma P with the first off-time $T_{off}1$ as disclosed above (S30). Subsequently, after the pulse modulator 110 changes the loop number m to 2 (S41) and changes the first off-time $T_{off}1$ to the second off-time $T_{off}2$ (S42), the optical spectrometer 120 measures the optical emission OE of the pulsed plasma P having the second off-time $T_{off2}$ (S30). Similarly, after the pulse modulator 110 changes the loop number m from 2 to 3 (S41) and changes the second off-time $T_{off}2$ to the third off-time $T_{off}3$ (S42), the optical spectrometer 120 measures the optical emission OE of the pulsed plasma P having the third off-time $T_{off}3$ (S30). Similarly, after the pulse modulator 110 changes the loop number m from 3 to 4 (S41) and changes the third off-time $T_{off}3$ to the fourth off-time $T_{off}4$ (S42), the optical spectrometer 120 measures the optical emission OE of the pulsed plasma P having the fourth off-time $T_{off}4$ (S30). At this time, if the preset number of loops N is 4, the pulse modulator 110 stops changing of the off-time $T_{off}$ (S40), and the next step is performed (S50).

Specifically, referring to FIG. 6, according to embodiments, when the loop number m goes from 1 to 4, the optical spectrometer 120 measures the optical emission OE of the pulsed plasma P based on the off-time $T_{off}$ during the first to fourth pulsed plasma cycles Tp1 to Tp4 (S30), and the optical spectrometer 120 outputs each of the first to fourth optical emission data J1 to J4 accordingly. At this time, the first to fourth pulsed plasma cycles Tp1 to Tp4 may have substantially the same time. Hereinafter, it is assumed that all of the first to fourth pulsed plasma cycles Tp1 to Tp4 are 100 ms.

For example, according to embodiments, when the loop number m is 1, the optical spectrometer 120 outputs the first optical emission data J1 of the pulsed plasma P having a first off-time $T_{off}1$ of 50 ms at the first pulsed plasma cycle Tp1. That is, the first duty ratio DR1 of the first pulsed plasma cycle Tp1 is 50%. At this time, a first initial optical emission value R1 of the first optical emission data J1 is not 0. This is because some target radicals R may be left rather than entirely disappearing during the off-time $T_{off}$. As described above with reference to the description of FIG. 2, during the off-time $T_{off}$, because there are no drawn electrons even if there are target radicals R, the optical emission OE cannot be measured. However, if the off-time $T_{off}$ is short and there are target radicals R at the start of the on-time $T_{on}$, the initial optical emission value of the optical emission data J may not be 0.

Similarly, according to embodiments, when the loop number m is 2, the optical spectrometer 120 outputs the second optical emission data J2 of the pulsed plasma P having a second off-time $T_{off}2$ of 37.5 ms, shorter than the first off-time $T_{off}1$, at the second pulsed plasma cycle Tp2. That is, during the second pulsed plasma cycle Tp2, the second duty ratio DR2 is 62.5%. At this time, a second initial optical emission value R2 of the second optical emission data J2 is greater than the first initial optical emission value R1. That is, as the second off-time $T_{off}2$ becomes shorter than the first off-time $T_{off}1$, the number of target radicals R remaining without disappearing during the second off-time $T_{off}2$ is greater than the number of target radicals R remaining without disappearing during the first off-time $T_{off}1$.

In subsequent loops, according to embodiments, the duty ratio continuously increases. That is, when the loop number m is 3, the third off-time $T_{off}3$ during the third pulsed plasma cycle Tp3, e.g., 25 ms, is less than the second off-time $T_{off}2$, and the fourth off-time $T_{off}4$ during the fourth pulsed plasma cycle Tp4, e.g., 12.5 ms, is less than the third off-time $T_{off}3$. As a result, the third initial emission value R3 is greater than the second initial emission value R2, and the fourth initial emission value R4 is greater than the third initial emission value R3.

Referring again to FIGS. 1a to 3, according to embodiments, based on the changes of the initial optical emission values of the optical emission data J during the off-time $T_{off}$, the concentration [R] of the target radicals R during the off-time $T_{off}$ is estimated (S50).

Specifically, according to embodiments, the concentration estimating module 130 estimates the concentration [R] of the target radicals R during the off-time $T_{off}$ and outputs the estimated concentration EC based on changes of the initial optical emission value of the optical emission data J with respect to the off-time $T_{off}$.

According to embodiments, the optical emission data J may be expressed as a function of time J(t) by the following Formula 1.

$$J(t)=k(Te,t) \cdot ne(t) \cdot [R](t) \approx K1 \cdot [R](t) \qquad \text{[Formula 1]}$$

Here, the term k(Te, t) represents the temperature Te of electrons in the plasma chamber 10 at time t, the term ne(t) represents the density of electrons in the plasma chamber 10 at time t, the term [R](t) represents the radical concentration at time t, and K1 is a constant. That is, the concentration [R] of the target radical R during the off-time $T_{off}$ is expressed as [R](t). According to embodiments, assuming that K(Te, k) and ne(t) have a constant value K1 during the off-time $T_{off}$, the optical omission data J and the concentration [R] of the target radical R are linearly proportional to each other. Therefore, the concentration [R] of a target radical R having an arbitrary unit can be estimated from the optical emission data J to provide the estimated concentration EC.

Specifically, according to embodiments, referring to FIG. 7, the concentration estimating module 130 outputs the estimated concentration EC by outputting the first to fourth initial optical emission values R1 to R4 of FIG. 6 as the function values of the first to fourth off-times $T_{off}1$ to $T_{off}4$ corresponding thereto. As described above with reference to FIG. 2, the optical emission OE increases during the on-time $T_{on}$, as the concentration [R] of the target radicals R increases. That is, the concentration estimating module 130 measures the optical emission OE of the target radicals R remaining after the off-time $T_{off}$ from the initial optical emission value measured during the on-time $T_{on}$, and records the optical emission as a function of the off time $T_{off}$ to estimate a change in the concentration [R] of the target radical R during the off-time $T_{off}$. At this time, R0 is defined as the concentration [R] of the target radicals R when the off-time $T_{off}$ is 0.

Accordingly, the concentration estimating module 130 estimates the concentration [R] of the target radical R during the off-time $T_{off}$ and outputs the estimated concentration EC based on the initial optical emission value of the optical emission data J that changes according to the off-time $T_{off}$.

Referring again to FIGS. 1a to 3, according to embodiments, a fitting function FF that fits the estimated concentration EC is determined (S60).

Specifically, according to embodiments, the concentration estimating module 130 determines a fitting function FF that fits the estimated concentration EC. For example, referring to FIG. 7, the concentration estimating module 130 determines a fitting function FF with function values that fit the first to fourth initial optical emission values R1 to R4 corresponding to first to fourth off-times ($T_{off}1$ to $T_{off}4$). At this time, since the fitting function FF is a function of time (t), the fitting function FF can be expressed as FF(t). As a result, the concentration estimating module 130 also outputs the estimated concentration EC of the undetected off-time $T_{off}$.

Subsequently, according to embodiments, the lifetime RL of the target radical R is determined (S70).

Specifically, according to embodiments, the concentration estimating module 130 determines the lifetime RL of the target radical R based on the fitting function FF. More specifically, the concentration estimating module 130 defines the time when the value of the fitting function FF(t) falls below a preset value as the lifetime RL of the target radical R. Further, the concentration estimating module 130 determines this time as the lifetime RL of the target radicals R.

In some embodiments, the concentration estimating module 130 determines the time T1 when the fitting function FF has a value expressed by the right side of the following formula 2, as the lifetime RL of the target radical R.

$$FP(Tl)=R0/e,\qquad \text{[Formula 2]}$$

where FF is the fitting function, R0 is the concentration of the target radical when the off-time is 0, and e is the base of the natural logarithms.

For example, referring to FIG. 7, the concentration estimating module 130 outputs a time T1 at which the value of the fitting function FF becomes R0/e, as the lifetime RL of the target radical R.

Accordingly, according to embodiments, the pulsed plasma analyzer 100 according to some embodiments of the present inventive concept can simultaneously analyze the kinetics of various types of radicals by simultaneously measuring the optical emission OE of the various types of target radicals R, unlike other apparatuses, such as a monochromator with a photomultiplier tube (PMT), which analyzes only one kind of target radical R. For example, the pulsed plasma analyzer 100 can simultaneously measure optical emissions OE having wavelengths of 300 nm to 850 nm.

Further, unlike other apparatuses with poor spectroscopic resolution, such as a FTOES, the pulsed plasma analyzer 100 has a precise spectral resolution by spectrally separating the optical emission OE to measure different types of target radicals R. For example, the pulsed plasma analyzer 100 can measure the optical emission OE of a target radical R with a spectral resolution of 2 nm.

Further, unlike other apparatuses with poor time resolution, such as a Verity OES, the pulsed plasma analyzer 100 can measure the optical emission OE of a target radical R with precise time resolution, by having a short gate width gw. For example, the pulsed plasma analyzer 100 can measure the optical emission OE of the target radical R with the time resolution of 1 μs.

Therefore, according to embodiments, the pulsed plasma analyzer 100 can precisely measure the estimated concentration EC, the fitting function FF, and the lifetime RL of the target radical R.

Hereinafter, a pulsed plasma analyzer 200 according to some embodiments of the present inventive concept will be described with reference to FIGS. 8 to 10b. For the sake of convenience of explanation, repeated parts of the embodiments described with reference to FIGS. 1a to 7 will be briefly described or omitted.

Figure 8:
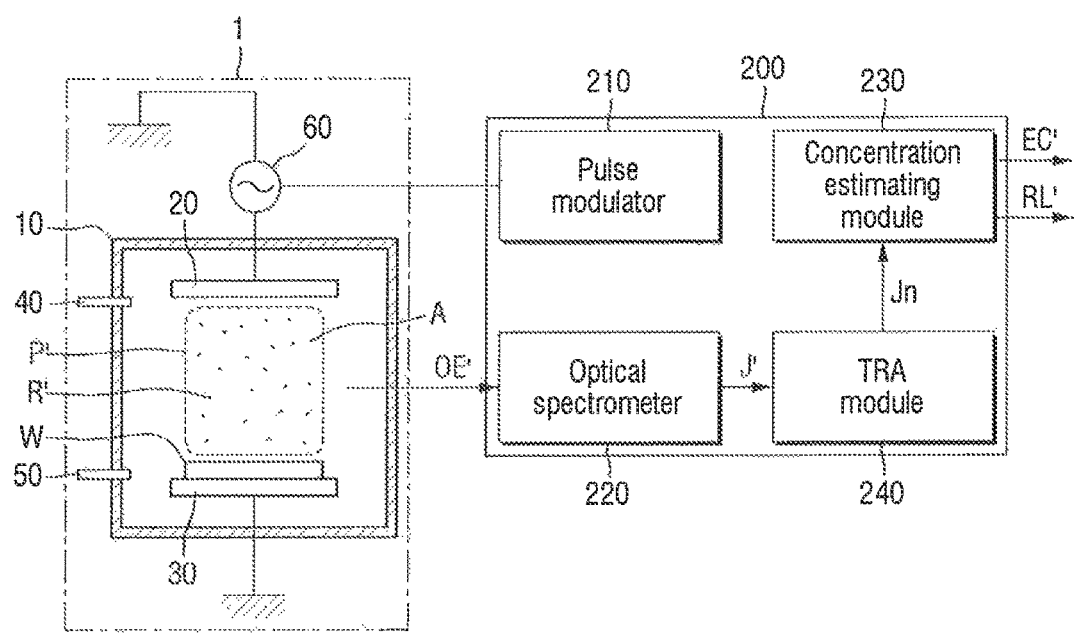
FIG. 8 illustrates a pulsed plasma analyzer according to some embodiments of the present inventive concept.
Figure 9:
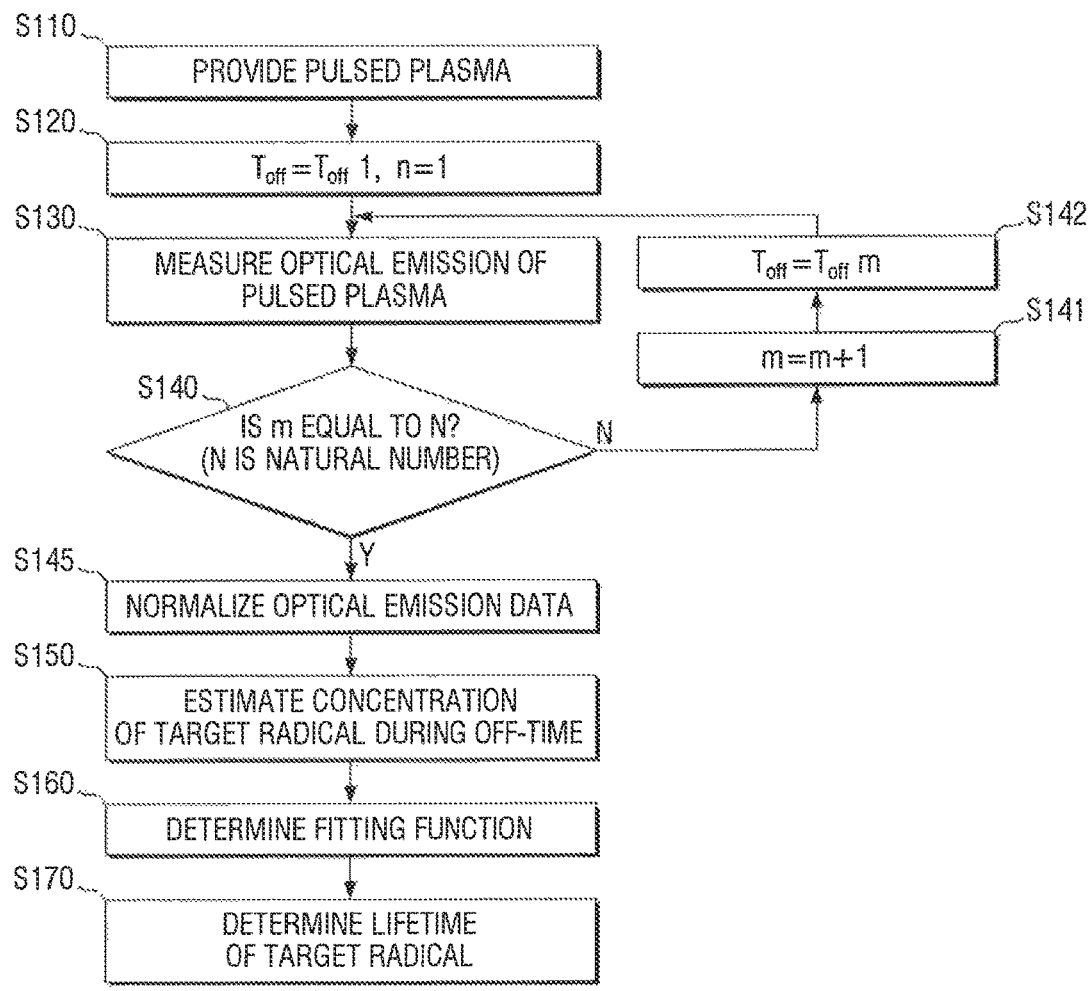
FIG. 9 is a flowchart of a method of operating a pulsed plasma analyzer of FIG. 8.
Figure 10A:
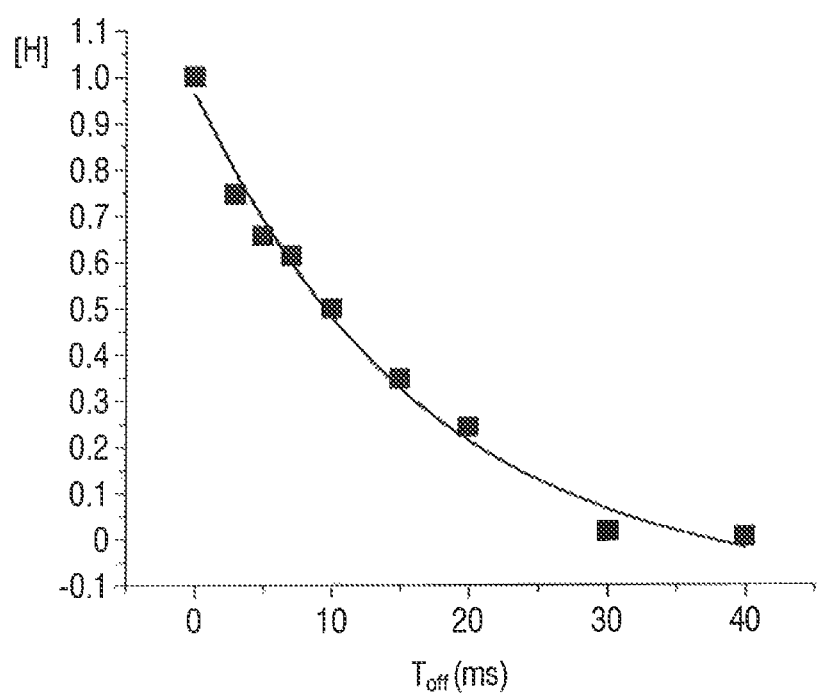
FIGS. 10a and 10b are graphs of the concentration of the target radical during the off-time as estimated by the pulsed plasma analyzer of FIG. 8.
Figure 10B:
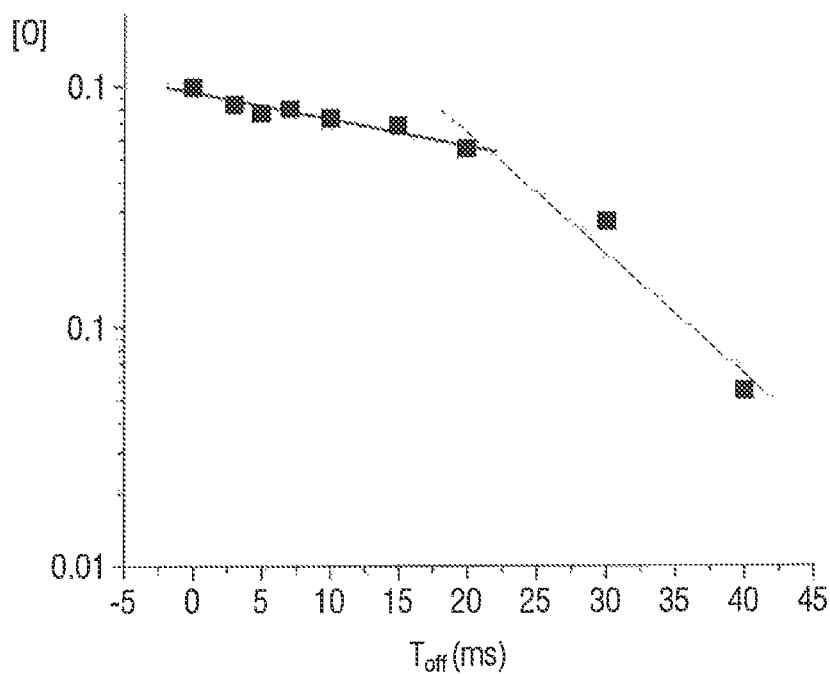

FIG. 8 illustrates a pulsed plasma analyzer according to some embodiments of the present inventive concept. FIG. 9 is a flowchart of a method of operating a pulsed plasma analyzer of FIG. 8. FIGS. 10a and 10b are graphs of the concentration of the target radical during the off-time estimated by the pulsed plasma analyzer of FIG. 8.

Referring to FIG. 8, the pulsed plasma analyzer 200 includes a pulse modulator 210, an optical spectrometer 220, a concentration estimating module 230 and a time-resolved actinometry (TRA) module 240. The pulse modulator 210, the optical spectrometer 220 and the concentration estimating module 230 of the pulsed plasma analyzer 200 correspond to the pulse modulator 110, the optical spectrometer 120 and the concentration estimating module 130 of FIG. 1a, respectively.

Referring to FIG. 9, steps S110, S120, S130, S140, S141, S142, S150, S160 and S170 correspond to steps S10, S20, S30, S40, S41, S42, S50, S60 and S70 of FIG. 3, respectively.

That is, according to embodiments, the pulse modulator 210 can adjust the off-time of the pulsed plasma P' that includes the target radicals R', and the optical spectrometer 220 can measure the optical emission OE' of the pulsed plasma P' after the off-time to output the optical emission data J'. Further, the concentration estimating module 230 can estimate the concentration of the target radical R' during the off-time and determine an estimated concentration EC' based on the initial optical emission value of the optical emission data J' that changes during the off-time.

According to embodiments, the pulsed plasma P' in the plasma chamber 10 further includes an actinometer A. The actinometer A contains an inert gas with a low reactivity, such as argon (Ar). Therefore, the optical emission data J' includes optical emission data Jr of the target radical and optical emission data Ja of the actinometer.

Referring to FIGS. 8 and 9, according to embodiments, the optical emission data J' is normalized by the optical emission data Jn of the actinometer to provide normalized optical emission data Ja (S145).

Specifically, according to embodiments, the TRA module 240 determines the normalized optical emission data Jn by normalizing the optical emission data J' received from the optical spectrometer 220 by the following Formula 3.

As described above in the description of Formula 1, the optical emission data J' can be expressed as a function of time J'(t). Likewise, the optical emission data Jr of the target radical, the optical emission data Ja of the actinometer and the normalized optical emission data Jn may be expressed by Jr(t), Ja(t) and Jn(It), respectively:

$$Jn(t)=\frac{Jr(t)}{Ja(t)}=\frac{kr(Te,t)\cdot ner(t)\cdot [Rr](t)}{ka(Te,t)\cdot nea(t)\cdot [Ra](t)}\approx K2\cdot [Rr](t),\qquad \text{[Formula 3]}$$

wherein K2 is a constant.

As in Formula 1, terms kr(Te, t), ner(t), and [Rr](t) represent the temperature of electrons of the target radical R' in the plasma chamber 10, the density of electrons and the concentration of radicals, respectively. Also, terms kr(Te, t), nea(t), and [Ra](t) represent the temperature of electrons of the actinometer A in the plasma chamber 10, the density of electrons and the concentration of radicals, respectively. These terms can be expressed as a function of time (t).

According to embodiments, since kr(Te, t) and ka(Te, t) are functions of temperature and time, the ratio of kr(Te, t) to ka(Te, t) can be assumed to be constant. That is, by normalizing kr(Te, t) to ka(Te, t), it is possible to reduce errors due to temperature changes of electrons in the plasma chamber 10.

In addition, according to embodiments, because both ner(t) and nea(t) represent the density of electrons drawn into the plasma chamber 10 by the power supply 60, they are identical to each other. That is, by normalizing ner(t) to nea(t), it is possible to ignore errors caused by density changes of electrons in the plasma chamber 10.

The term [Ra](t) represents the concentration of the radicals of the actinometer A. The radicals of the actinometer A have a low activity and thus can be assumed to have a constant concentration during the on-time of the pulsed plasma P'. That is, [Ra](t) can be treated as a constant.

As a result, the normalized optical emission data Jn is linearly proportional to the concentration of the target radicals R'.

That is, according to embodiments, the normalized optical emission data Jn can precisely estimate the concentration of the target radicals by minimizing the errors caused by temperature changes of the electrons, density changes of the electrons, etc., in the plasma chamber 10, using the actinometer A.

According to embodiments, as a result, the TRA module 240 normalizes the optical emission data J' by Formula 3 and outputs the normalized optical emission data Jn that more precisely estimates the concentration changes of the target radicals R'.

Subsequently, according to embodiments, the concentration estimating module 230 estimates the concentration of the target radical R' during the off-time and outputs the estimated concentration EC' based on the initial optical emission value of the normalized optical emission data Jn. The estimated concentration EC' can be determined by the concentration estimating module 230 similarly to the estimated concentration EC by the concentration estimating module 130 of FIG. 1a, as disclosed in the description of FIGS. 6 and 7.

FIG. 10a is a graph of the concentration of H radicals during the off-time as estimated by the concentration estimating module 230, and FIG. 10b is a graph of the concentration of O radicals during the off-time as estimated by the concentration estimating module 230. That is, as illustrated in the graphs of FIGS. 10a and 10b, the concentration estimating module 230 can estimate the concentration of the target radicals during the off-time.

In some embodiments, the concentration estimating module 230 determines a fitting function that fits the estimated concentration EC. As described above with reference to FIG. 7, the concentration estimating module 230 fits the estimated concentration EC similar to how the concentration estimating module 130 of FIG. 1a determines the fitting function FF.

In some embodiments, the concentration estimating module 230 determines a lifetime RL' of the target radical R'. As described above in the description of Formula 2, the lifetime RL' of the target radical R' can be determined by the concentration estimating module 230 similar to how the lifetime RL of the target radical R is determined by the concentration estimating module 130 of FIG. 1a.

As a result, the pulsed plasma analyzer 200 according to some embodiments of the present inventive concept can simultaneously analyze the kinetics of various types of radicals, have a precise spectral resolution and measure the optical emission OE' of the target radicals R' with a precise time resolution. Further, the pulsed plasma analyzer 200 normalizes optical emission data Jn that more precisely estimates the concentration changes of the target radicals R' than the optical emission data J', to more precisely determine the estimated concentration EC' and the lifetime RL' of the target radical R'.

Hereinafter, a plasma device according to some embodiments of the present inventive concept will be described with reference to FIG. 11. For the sake of convenience of explanation, repeated portions of the embodiments described with reference to FIGS. 1a to 9 will be briefly described or omitted.

Figure 11:
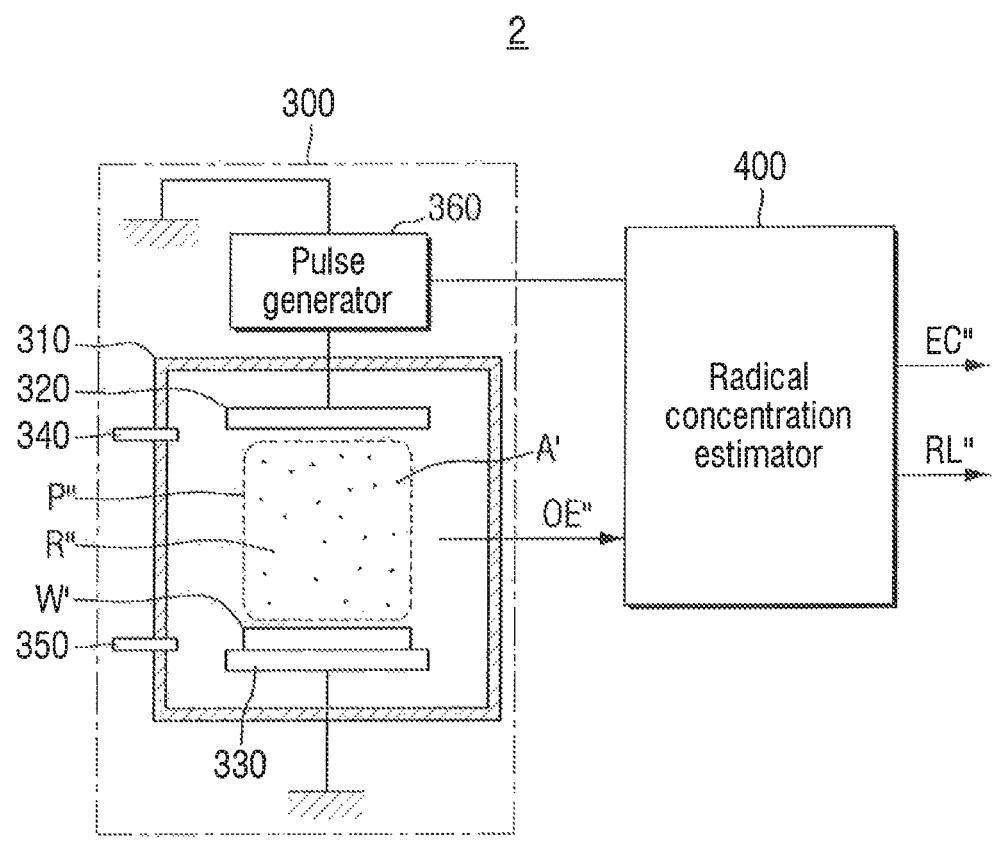
FIG. 11 illustrates a plasma device according to some embodiments of the present inventive concept.

FIG. 11 illustrates a plasma device according to some embodiments of the present inventive concept.

Referring to FIG. 11, the plasma device 2 includes a pulsed plasma device 300 and a radical concentration estimator 400.

According to an embodiment, the pulsed plasma device 300 includes a plasma chamber 310, an upper electrode 320, a lower electrode 330, a gas supply pipe 340, a gas exhaust pipe 350 and a pulse generator 360. The plasma chamber 310, the upper electrode 320, the lower electrode 330, the gas supply pipe 340 and the gas exhaust pipe 350 of the pulsed plasma device 300 correspond to each of the plasma chamber, 10 the upper electrode 20, the lower electrode 30, the gas supply pipe 40 and the gas exhaust pipe 50 of the pulsed plasma device 1 of FIG. 1a.

According to an embodiment, the radical concentration estimator 400 outputs the concentration EC" estimated from the optical emission OE" of the target radicals R" and the lifetime RL" of the target radicals R". The concentration EC" and the lifetime RL" of the target radicals R" determined by the radical concentration estimator 400 is estimated similar to how the concentration EC and the lifetime RL of the target radicals R is estimated by the pulsed plasma analyzer 100 of FIG. 1a, or how the concentration EC' and lifetime RL' of the target radicals R' is estimated by the pulsed plasma analyzer 200 of FIG. 8.

Hereinafter, an operation of a plasma device according to some embodiments of the present inventive concept will be described with reference to FIG. 11 and FIG. 12.

Figure 12:
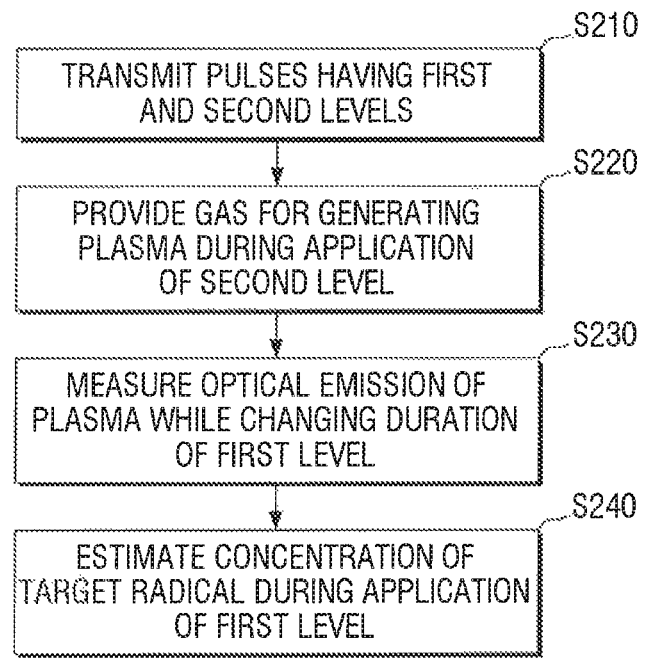
FIG. 12 is a flowchart of a method of operating a plasma device according to some embodiments of the present inventive concept.

FIG. 12 is a flowchart of a method of operating a plasma device according to some embodiments of the present inventive concept.

Referring to FIGS. 11 and 12, pulses having first and second levels (LV1', LV2') are transmitted to the interior of the plasma chamber 310 (S210).

Specifically, according to an embodiment, the pulse generator 360 applies a voltage having pulses of first and second levels (LV1', LV2') to the interior of the plasma chamber 310. The first and second levels (LV1', LV2') correspond to the first and second levels (LV1, LV2) of FIG. 2.

In addition, according to an embodiment, the pulse generator 360 adjusts the pulse of the applied voltage. The pulse of the applied voltage is adjusted by the pulse generator 360 similar to how the pulse of the power supply 60 is adjusted by the pulse modulator 110 of FIG. 1a.

Subsequently, according to an embodiment, a gas which includes elements for generating the target radicals R" during application of the second level LV2' pulse is provided into the plasma chamber 310 (S220). The pulse generator 360 generates the plasma P" when the second level LV2" pulse is applied to the interior of the plasma chamber 310.

Further, according to an embodiment, the plasma P" may further include an actinometer A'. The target radicals R" and the actinometer A' of the plasma P''' correspond to the target radical R' and actinometer A of the pulsed plasma P' of FIG. 8.

Subsequently, according to an embodiment, the optical emission OE'' of the plasma P''' is measured while changing the duration of the first level LV1 pulse (S230).

Specifically, according to an embodiment, the measurement of the optical emission OE'' of the plasma P''' is performed as described above in the description of steps (S30 to S42) of FIG. 3. That is, the radical concentration estimator 400 measures the optical emission OE'' of the plasma P''' in the same manner as the optical spectrometer 120 of FIG. 1a measures the optical emission OE or the optical spectrometer 220 of FIG. 8 measures the optical emission OE'.

Subsequently, according to an embodiment, the concentration of the target radical R'' is estimated during application of the first level LV1 pulse, based on the measured optical emission (S240).

Specifically, according to an embodiment, the concentration of the target radical R'' can be estimated as described above in the description of step S50 of FIG. 3. That is, the radical concentration estimator 400 can estimate the concentration of the target radical R'' in the same manner as the concentration estimating module 130 of FIG. 1a estimates the concentration of the target radical R or as the concentration estimating module 230 of FIG. 8 estimates the concentration of the target radical R'.

In some embodiments, a fitting function that fits the estimated concentrations is further provided. Specifically, the radical concentration estimator 400 determines a fitting function in the same way as the concentration estimating module 130 of FIG. 1a determines the fitting function FF.

In some embodiments, the lifetime RL'' of the target radical R'' is further provided. More specifically, the radical concentration estimator 400 determines the lifetime RL'' of the target radical'' in the same way that the concentration estimating module 130 of FIG. 1a determines the lifetime RL of the target radical R.

Thus, the plasma device 2 according to some embodiments of the present inventive concept can simultaneously analyze the kinetics of various types of radicals, have accurate spectral resolution, and measure the optical emission OE'' of the target radical R'' with an accurate time resolution. Further, the plasma device 2 can precisely estimate the concentration EC'' and the lifetime RL'' of the target radical R''.

While embodiments of the present inventive concept has been particularly illustrated and described with reference to exemplary embodiments thereof, it will be understood by those of ordinary skill in the art that various changes in form and detail may be made therein without departing from the spirit and scope of the embodiments of the present inventive concept as defined by the following claims. The exemplary embodiments should be considered in a descriptive sense only and not for purposes of limitation.

What is claimed is:

1. A pulsed plasma analyzer comprising:
 a pulse modulator that controls an off-time of a pulsed plasma that includes a target radical;
 an optical spectrometer that measures optical emissions of the pulsed plasma after the off-time and outputs optical emission data; and
 a concentration estimating module that estimates a concentration of the target radical during the off-time, based on an initial optical emission value of the optical emission data that changes as a function of the off-time, and outputs the estimated concentration.

2. The pulsed plasma analyzer of claim 1, wherein the optical spectrometer measures the optical emissions of the pulsed plasma after the off-time by a time-gated method.

3. The pulsed plasma analyzer of claim 1, wherein the concentration estimating module estimates a fitting function that fits the estimated concentration and estimates a lifetime of the target radical based on the fitting function.

4. The pulsed plasma analyzer of claim 3, wherein the lifetime of the target radical is a time (Tl) wherein the fitting function (FF) has a value FF(Tl) expressed by FF(Tl)=R0/e,
 wherein R0 represents the concentration of the target radical when the off-time is 0, and e is the base of a natural logarithm.

5. The pulsed plasma analyzer of claim 1, further comprising:
 a time-resolved actinometry (TRA) module which normalizes the optical emission data according to Jn=Jr/Ja, wherein Jn represents the normalized optical emission data, Jr represents optical emission data of the target radical in the optical emission data, and Ja represents optical emission data of the actinometer in the optical emission data, to estimate normalized optical emission data (Jn),
 wherein the pulsed plasma further comprises an actinometer, and
 the concentration estimating module estimates the concentration of the target radical during the off-time based on the initial optical emission value of the normalized optical emission data, and outputs the estimated concentration.

6. The pulsed plasma analyzer of claim 5, wherein the optical emission data is estimated by measuring the optical emission of the pulsed plasma after the off-time by a time-gated method.

7. The pulsed plasma analyzer of claim 5, wherein the actinometer comprises argon (Ar).

8. A plasma device comprising:
 a pulsed plasma that includes a pulse generator that generates a pulse having first and second levels, and a plasma chamber in which a plasma containing a target radical is generated while a second level pulse is applied; and
 a radical concentration estimator that estimates a concentration of the target radical while a first level pulse is applied,
 wherein the radical concentration estimator measures optical emissions of the plasma while changing a duration of the first level pulse, and estimates the concentration of the target radical while the second level pulse is applied based on the measured optical emission.

9. The plasma device of claim 8, wherein the radical concentration estimator measures the optical emissions of the target radical by a time-gated method.

10. The plasma device of claim 8, wherein the plasma further comprises an actinometer, and
 the radical concentration estimator normalizes the measured optical emissions using the optical emission of the actinometer, and estimates the concentration of the target radical during application of the first level pulse based on the normalized optical emissions.

11. The plasma device of claim 10, wherein the actinometer comprises argon (Ar).

12. The plasma device of claim 8, wherein the radical concentration estimator estimates a fitting function that fits the estimated concentration, and estimates a lifetime of the target radical based on the fitting function.

13. The plasma device of claim 12, wherein the lifetime of the target radical is a time (Tl) wherein the fitting function (FF) has a value FF(Tl) expressed by FF(Tl)=R0/e, wherein R0 represents the concentration of the target radical when the time of the duration of the first level pulse is 0, and e is the base of a natural logarithm.

14. A method of operating a pulsed plasma analyzer, comprising the steps of:
providing a pulsed voltage into a plasma chamber to generate a pulsed plasma inside the plasma chamber;
initializing an off-time of the pulsed plasma and a counter which counts a number of changes of the off-time;
measuring optical emissions of the pulsed plasma;
estimating a concentration of a target radical during the off-time based on changes of initial optical emission values of the optical emission data during the off-time, when the counter is equal to a preset maximum;
determining a fitting function that fits the estimated concentration; and
estimating a lifetime of the target radical as a time when a value of the fitting function falls below a preset value.

15. The method of claim 14, wherein the optical emissions are measured using a time-gated method.

16. The method of claim 14, further comprising adjusting the off-time of the pulsed plasma and incrementing the counter, when the counter is not equal to the preset maximum.

17. The method of claim 14, wherein the concentration [R] of the target radicals R during the off-time is estimated from $J(t)=k(Te,t) \cdot ne(t) \cdot [R](t) \approx K1 \cdot [R](t)$,
wherein k(Te, t) represents the temperature Te of electrons in the plasma chamber at time t, ne(t) represents the density of electrons in the plasma chamber at time t, [R](t) represents the radical concentration at time t, and K1 is a constant.

18. The method of claim 14, wherein the lifetime RL of the target radical R is determined as a time Tl when the fitting function FF has a value FF(Tl) expressed by FF(Tl)=R0/e, where FF is the fitting function, R0 is the concentration of the target radical when the off-time is 0, and e is the base of the natural logarithms.

19. The method of claim 14, further comprising normalizing the optical emission data by optical emission data Jn of an actinometer to output normalized optical emission data according to Jn=Jr/Ja, wherein Jn represents the normalized optical emission data, Jr represents optical emission data of the target radical in the optical emission data, and Ja represents optical emission data of the actinometer in the optical emission data.

* * * * *